United States Patent [19]
Eagan

[11] Patent Number: 5,828,298
[45] Date of Patent: Oct. 27, 1998

[54] DEVICE AND METHOD FOR SENSING WHEN EXTERIOR VEHICLE LIGHTS ARE ON

[76] Inventor: Chris S. Eagan, 670 Eldorado La., Las Vegas, Nev. 89123

[21] Appl. No.: 855,870

[22] Filed: May 12, 1997

[51] Int. Cl.⁶ ............................................. B60Q 11/00
[52] U.S. Cl. .................... 340/458; 340/459; 340/461; 340/641
[58] Field of Search .................... 340/438, 458, 340/459, 460, 461, 462, 525, 815.42, 815.46, 908.1, 641, 642; 362/80.1, 83.3, 276, 802; 315/82; 307/10.8

[56] References Cited

U.S. PATENT DOCUMENTS

| | | | |
|---|---|---|---|
| 4,016,534 | 4/1977 | Kobayashi et al. | 340/461 |
| 4,045,497 | 8/1977 | Ohta | 340/461 |
| 4,088,980 | 5/1978 | Tanigawa et al. | 340/461 |
| 4,234,866 | 11/1980 | Kuroda et al. | 340/461 |
| 5,072,209 | 12/1991 | Hori et al. | 340/461 |
| 5,272,464 | 12/1993 | Jorgensen | 340/461 |
| 5,373,357 | 12/1994 | Hopkins et al. | 365/121 |
| 5,386,208 | 1/1995 | Coon, III | 340/461 |
| 5,412,381 | 5/1995 | Dicks | 340/908.1 |
| 5,473,515 | 12/1995 | Liu | 362/80.1 |
| 5,515,028 | 5/1996 | Dittmar | 340/461 |

*Primary Examiner*—Edward Lefkowitz
*Assistant Examiner*—Van T. Trieu
*Attorney, Agent, or Firm*—Harry M. Weiss; Jeffrey D. Moy; Harry M. Weiss & Associates, P.C.

[57] ABSTRACT

Various embodiments are shown for sensing when an exterior vehicle light is turned on and for displaying the condition that the exterior vehicle light is on or operating. Solar cells are used to sense that the exterior vehicle light is on and to provide an electrical current to a display unit that indicates that the exterior vehicle light is on. A wireless arrangement is also disclosed as well as an all-in-one unit is disclosed for sensing when a exterior vehicle light is on and for displaying by a visual and/or audio indication that the exterior vehicle light is on.

52 Claims, 5 Drawing Sheets

DEVICE AND METHOD FOR SENSING WHEN EXTERIOR VEHICLE LIGHTS ARE ON

FIELD OF THE INVENTION

This invention relates generally to devices and methods for sensing when lights are turned on and, more particularly, to devices and methods for sensing when exterior vehicle lights are turned on.

BACKGROUND OF THE PRIOR ART

In the past, it has been somewhat cumbersome and time consuming to try to correct a situation where a vehicle exterior light fails to turn on. For example, there are several different types of exterior vehicle lights which, over time and extended use, will fail. Some of these exterior vehicle lights are very important either to the operation of the vehicle or to the safety of the driver and/or passenger(s) in the vehicle. The failure of one of the two headlights to turn on is a serious vehicle operation and safety problem because it limits road visibility during night driving and also makes it very difficult for a vehicle approaching the vehicle with only one operating headlight to know which headlight (driver's side or passenger's side) is on thereby providing a dangerous passing situation. In many states in the U.S.A., driving a vehicle with only one of the two headlights working is a traffic violation which can result in a somewhat expensive traffic ticket.

Similarly, driving a vehicle without working back brake lights or, as present in many new car models, back-up lights is also a very dangerous condition. Back brake lights flash a red warning light to vehicles driving behind the vehicle actuating a braking action and this red warning brake light signal provides immediate notice to the vehicle in the rear that the braking vehicle is in the process of slowing down. Consequently, if a vehicle's back brake lights fail or are not operational, vehicles in the rear of the braking vehicle can have a serious accident because they will not have the benefit of seeing the red braking action warning light and can only be warned by a rapidly narrowing distance between the front and rear vehicles. Thus, like front headlights, rear brake lights are important to the operation and safety of a vehicle and their reliability in operation is necessary. Correspondingly, rear back-up lights can alert vehicles and pedestrians behind the vehicle backing up that that vehicle is in a backing up mode of operation. In a backing up mode of operation, many drivers will not turn completely around in the drivers seat to view the area behind the vehicle backing up but will use one or more of the rear view and side view mirrors. Consequently, since most vehicles have a smaller rear window than the front windshield, it is difficult for a driver to have very good rear view vision and, thus, the back-up lights are very important in providing others (vehicles and pedestrians) behind the backing up vehicle with an indication that the vehicle is backing up so that an accident can be avoided.

Other exterior vehicle lights which serve a useful function, but are perhaps less critical are parking lights and directional signal lights. Directional signal lights can, in many instances, provide a vehicle trying to pass on one side or the other side with an earlier warning of the intended turning direction of the vehicle using the directional signal light which provides a front, rear and, in some vehicles, a side directional light signal. Many catastrophic accidents involving motorcycles attempting to pass a vehicle on the left or right can often be avoided by the use of operating directional lights, but often cannot be avoided if the side directional lights are not operation because of, for example, light bulb failure.

The exterior vehicle lights can fail usually because of the failure of the particular light bulb used in the particular exterior light element. For some exterior vehicle lights, such as headlights, a new entire light unit is usually used to replace a failed or defective headlight unit which will in certain instances also correct for a defective parking light. Other exterior lights such as back-up and brake lights will often fail if the applicable light bulb burns out and is no longer operational. Fuses in a fuse box usually under the front dashboard of a vehicle will occasionally fail with the result that a failed fuse, for example, in an electrical circuit that is electrically connected to an exterior vehicle light will have to be replaced in order to make the non-operational exterior vehicle light operational.

As a result, a person faced with the problem of a failed exterior light will not know without careful investigation of the failed exterior light problem whether the failed exterior light failed because of a burnt out light bulb or because of a failed fuse. Sometimes it is difficult to determine which fuse has failed and whether a replaced fuse will correct the failed exterior light problem.

In both situations where a person is trying to correct a failed exterior light problem by replacement of a failed light bulb or failed light unit or by replacement of a failed fuse, it is necessary to check the actual failed exterior vehicle light to see if the corrective action (replacement of a fuse or light bulb or light element) that has been taken has solved the problem. Checking of the failed exterior vehicle light was usually a somewhat time consuming process involving walking over to the location of the failed exterior vehicle light after one of the corrective actions (replacement of a fuse or light bulb or light element) have been taken and, in some instances, after the vehicle's ignition key is turned on. In many cases, several trips back and forth may be required to assure that one of the selected corrective actions was effective and the working condition of the exterior vehicle light was operational. This repeated checking process of the exterior vehicle light's operation was not only somewhat tedious, but also somewhat annoying especially if a person was working inside the vehicle lying in the front floor portion thereof trying to find and replace the correct fuse in the fuse box. Also for certain exterior vehicle lights such as the rear bark-up lights and the rear brakelights, a single person would have a great deal of difficulty in being able to check one of these exterior rear (back-up or brake) lights because they would need to be sitting in the driver's seat either stepping on the brakes to actuate the rear brake lights or placing the vehicle in rear gear or in the rear designation of the automatic transmission unit so that the respective (rear brake light or rear back-up light) exterior vehicle light was actuated into an on condition. Consequently, a second person was usually needed to be at the rear of the vehicle to check the exterior vehicle rear back-up light or rear brake light while a first person was in the driver's seat actuating the rear back-up light or rear brake light.

Thus, a need existed for providing a device and method for permitting one person to check the working operation of an exterior vehicle light from within the vehicle without the necessity of going outside the vehicle to the area of the exterior vehicle light that is being checked. A need also existed for providing a device and method for permitting one person to check the working operation of either rear back-up lights or rear brake lights from the driver's seat without going to the rear of the vehicle. A further need existed for a device and method which provided a portable (no D.C. battery or A.C. source) arrangement to indicate when an exterior vehicle light was on. A still further need existed for a portable, wireless (remote) arrangement for indicating when an exterior vehicle light is on.

SUMMARY OF THE INVENTION

It is an object of this invention to provide an improved device and method for sensing the operation of an exterior vehicle light.

It is a further object of this invention to provide an improved device and method for sensing the operation of a vehicle's exterior headlights, brake lights, rear back-up lights, directional signal lights and parking lights.

It is a still further object of this invention to provide an improved device and method for sensing within a vehicle when an exterior vehicle light is on.

It is still another object of this invention to provide an improved device and method for sensing when an exterior vehicle light is on by the use of a portable light sensing apparatus that does not use a D.C. battery or A.C. source of energy.

It is still a further object of this invention to provide an improved device and method for sensing when an exterior vehicle light is on by the use of solar cells to provide a source of current to activate a visual or audio type display unit.

It is another object of this invention to provide an improved device and method for wireless remote sensing when an exterior vehicle light is on by the use of solar cells coupled to the exterior vehicle light to provide a source of current to cause a transmitter coupled to the solar cells to transmit a signal to a remote receiving unit which provides a visual or audio response to indicate that the exterior vehicle light is on.

It is another object of this invention to provide an improved device and method which provides a single portable unit that both senses when an exterior vehicle light is on and provides a display (visual and/or audio) to indicate that the exterior vehicle light is on.

BRIEF DESCRIPTION OF THE PREFERRED EMBODIMENTS

In accordance with one embodiment of this invention, a device is provided for sensing when an exterior light on a vehicle is on comprising in combination; a vehicle having at least one exterior light element; light sensing means coupled to the one exterior light element to determine if the one exterior light element is on; and display means coupled to the light sensing means for providing at least one of a visual and audio indication when the one exterior light element is on.

In accordance with another embodiment of this invention, a method is provided for sensing when an exterior light on a vehicle is on comprising the steps of: providing a vehicle having at least one exterior light element; providing light sensing means coupled to the one exterior light element to determine if the one exterior light element is on; and providing display means coupled to the light sensing means for providing at least one of a visual and audio indication when the one exterior light element is on.

In accordance with still another embodiment of this invention, a device is provided for sensing when an exterior light on a vehicle is on comprising, in combination: a vehicle having at least one exterior light element; light sensing and electric current generating means coupled to the one exterior light element for both sensing when the one exterior light element is on and for generating an electric current indicating that the one exterior light element is on; and display means coupled to the light sensing and electric current generating means for providing at least one of a visual and audio indication when the one exterior light element is on.

In accordance with a still further embodiment of this invention, a combined light sensing and light on indication display device for an exterior light on a vehicle comprising, in combination: a vehicle having at least one exterior light element; and combined light sensing and light indication display means in a single, portable unit for both sensing when the one exterior light element is on and for providing at least one of a visual and audio indication when the one exterior light element is on.

In accordance with another embodiment of this invention, a wireless transmitter-receiver apparatus for sensing when an exterior light on a vehicle is on comprising, in combination: solar cell means for sensing when an exterior light on a vehicle is on and for generating an electric current when the exterior light is on; transmitter means coupled to the solar cell means for transmitting a signal following receipt of the electric current from the solar cell means; and receiver means spaced from the transmitter means for receiving the signal from the transmitter means and for providing at least one of a visual and audio indication that the exterior light is on.

The foregoing and other objects, features and advantages of this invention will be apparent from the following more particular description of the preferred embodiments of the invention as illustrated in the accompanying drawings.

BRIEF DESCRIPTION OF THE FIGURES

FIG. 5 is a side elevational view showing an enlarged exterior light of a vehicle and a solar cell light sensing device in adhesive contact with a front surface portion of the exterior light and electrically connected to a display unit that can provide a visual indication and/or an audio indication when the exterior light is on.

FIG. 6A is an enlarged front side elevational view of a solar cell light sensing device similar to the solar cell light sensing device of FIG. 5 (with surrounding adhesive) and an electrical line with a terminating plug or connector for electrically connecting the solar cell light sensing device to, for example, the display unit shown in FIG. 5 for providing the visual and/or audio indication when an exterior light under test is on.

FIG. 7D is a view somewhat similar to the view of FIG. 6D depicting the combined solar cell light sensing device and transmitter unit of FIGS. 7A and 7B located adjacent to a light source for transmitting a signal when the light source is on.

DESCRIPTION OF THE SPECIFICATION

Figure 1:
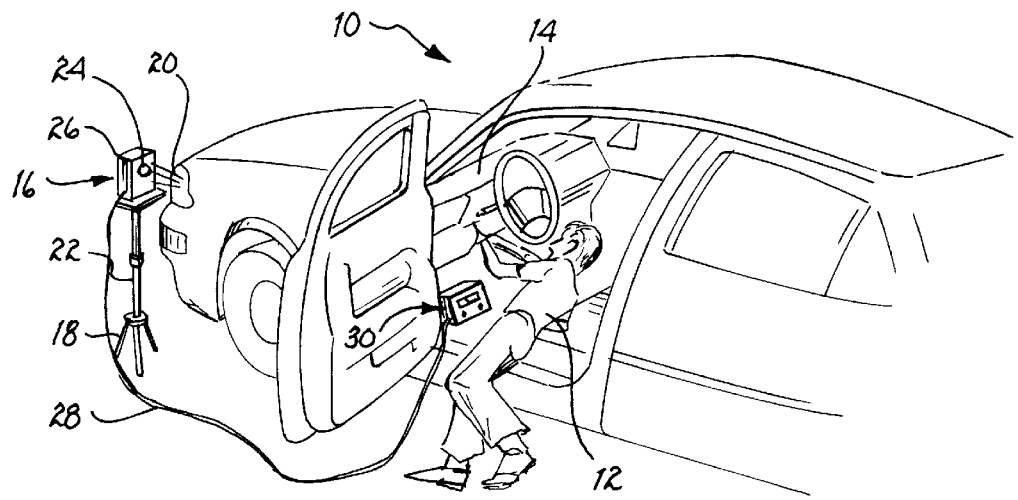
FIG. 1 is a perspective view of a exterior light sensing device located in front of an automobile and electrically connected to a display unit located on the floor of the front seat area of the automobile with a person in this area in the process of replacing a defective fuse in order to determine if the failed exterior light is now operational.

Referring to FIG. 1, a vehicle generally designated by reference number 10 is shown wherein a person 12 is shown in a position in the front seat area of the vehicle 10 for finding and replacing a defective fuse (not shown) in a fuse box (not shown) located below dashboard 14 of the vehicle 10. In the illustration of FIG. 1, a light sensing element 16 is shown, for example, mounted on a tripod type stand 18 in order to be positioned for the light sensing element 16 to be adjacent to, for example, driver's side front headlight 20 of the vehicle 10. Preferably, the tripod type stand 18 has a telescopic shaft assembly 22 in order to permit the light sensing element 16 to be raised or lowered, as desired, to the position where the light sensing element 16 is adjacent to an exterior light of a vehicle that is to be tested for light operation after, for example, a defective fuse is located and replaced. In the embodiment of FIG. 1, the exterior light to be sensed is the driver's side front headlight 20, however, the passenger side front headlight (not shown) can be similarly sensed as well as any of the back lights (not shown) of the vehicle 10. The light sensing element 16 is, for example, equipped with a lens 24 that permits light from the headlight 20 to enter box 26 that houses, for example, a photodetector. Thus, light from the headlight 20, when it is turned on, will cause the photodetector within the box 26 to send a signal by means of wire 28 that is connected to a display unit 30 located adjacent to the person 12 within the vehicle 10. While the vehicle 10 shown in FIG. 1 is a car, the term vehicle is intended to cover all types of vehicles including cars, trucks, vans, etc. In the embodiment depicted in FIG. 1, the person 12 is shown trying to find and replace a defective fuse in a fuse box located beneath the dashboard 14 on the driver's side of the vehicle 10, however, in some vehicles the fuse box is located in the front passenger side of the vehicle.

Figure 2:
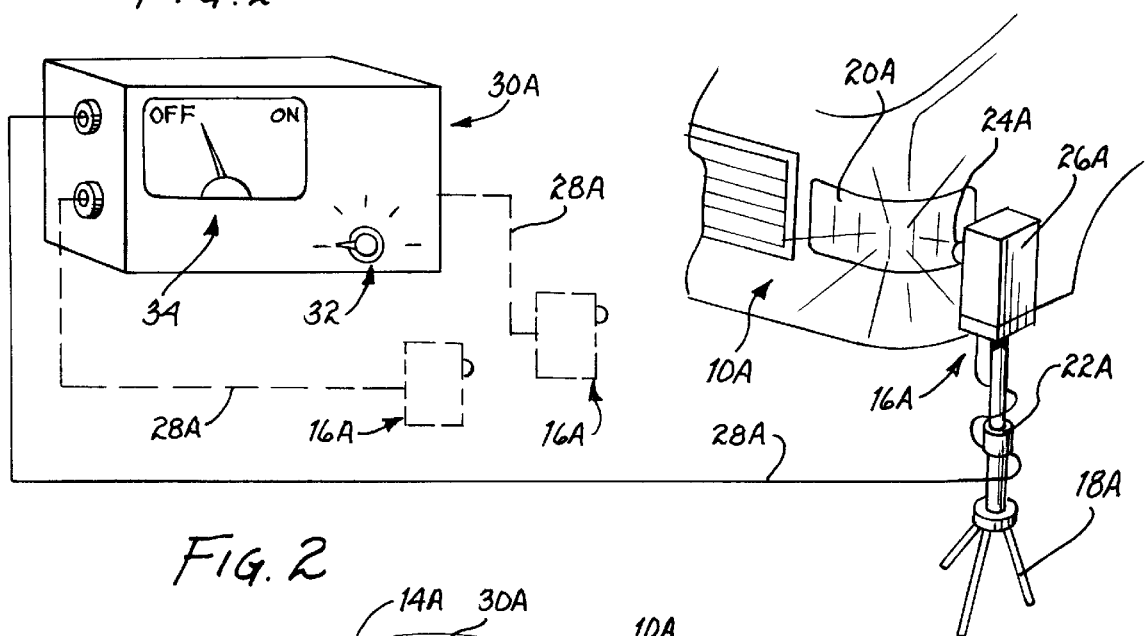
FIG. 2 is a perspective enlarged view of a display unit similar to the display unit of FIG. 1 which is capable of being connected to multiple light sensing devices and is shown electrically connected to an exterior light sensing device (mounted on a tripod) adjacent to the driver's front side exterior headlight.

Referring to FIG. 2, the same reference numbers are used to designate the corresponding elements that are shown in FIG. 1 with the addition of the letter A. In the embodiment of FIG. 2, display unit 30A permits, preferably, four separate light sensing elements 16A (one is shown in solid line form adjacent to headlight 20A while two other light sensing elements 16A are shown in dashed line form) are coupled to the display unit 30A (two inputs on one side of the display unit 30A for two of the light sensing elements 16A and two inputs (not shown) on the other side of the display unit 30A. In this manner the display unit 30A by means of four position switch 32 can be used to provide an "ON" (light on designation) indication on off-on indicator dial 34 for selectively one of the possibly four separate light sensing elements 16A that are connected to the display unit 30A.

Figure 3:
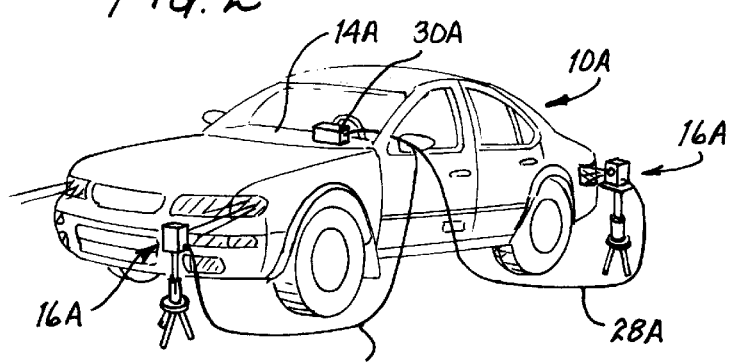
FIG. 3 is a perspective view showing a display unit similar to the display unit of FIG. 2 located inside an automobile on the front dashboard thereof and electrically connected to both a front and back exterior light sensing device of the type shown in FIGS. 1 and 2.

Referring to FIG. 3, the same reference numbers as used in FIG. 1 are used to designate the corresponding elements that are shown in FIG. 2. In FIG. 3, the display unit 30A is shown above or on the dashboard 14A to provide a higher elevational view within the vehicle 10 of the "on" (and correspondingly "off") status of one front and one rear light of the vehicle 10A.

Figure 4:
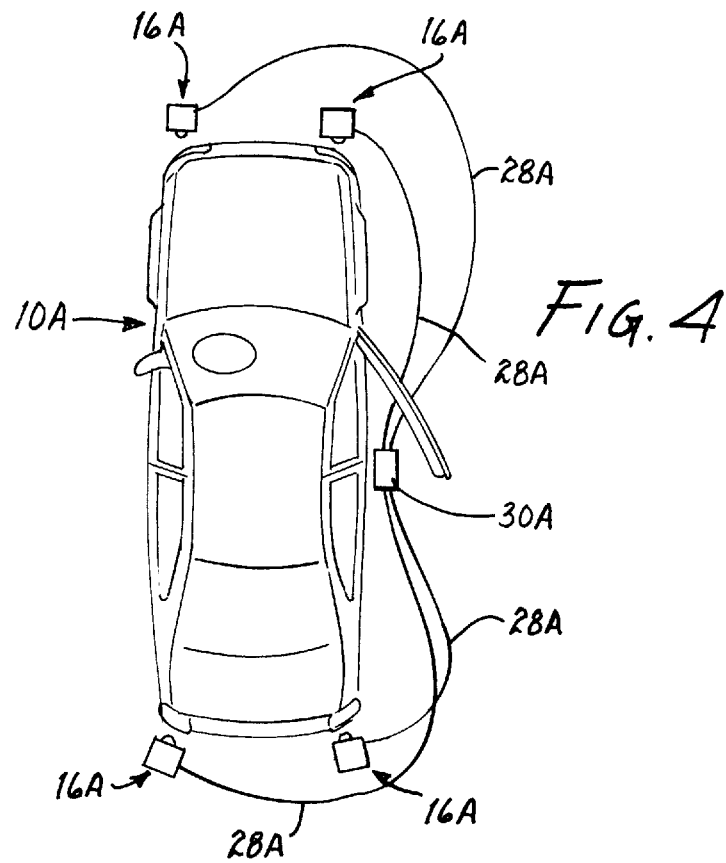
FIG. 4 is a top view showing a display unit similar to the display unit of FIG. 2 located outside the passenger side of the automobile and electrically connected up to four light sensing devices (for both front exterior lights and for both back exterior lights).

Referring to FIG. 4, four light sensing elements 16A are coupled to a single display unit 30A which is, in this embodiment, shown located outside the vehicle 10A.

Figure 5:
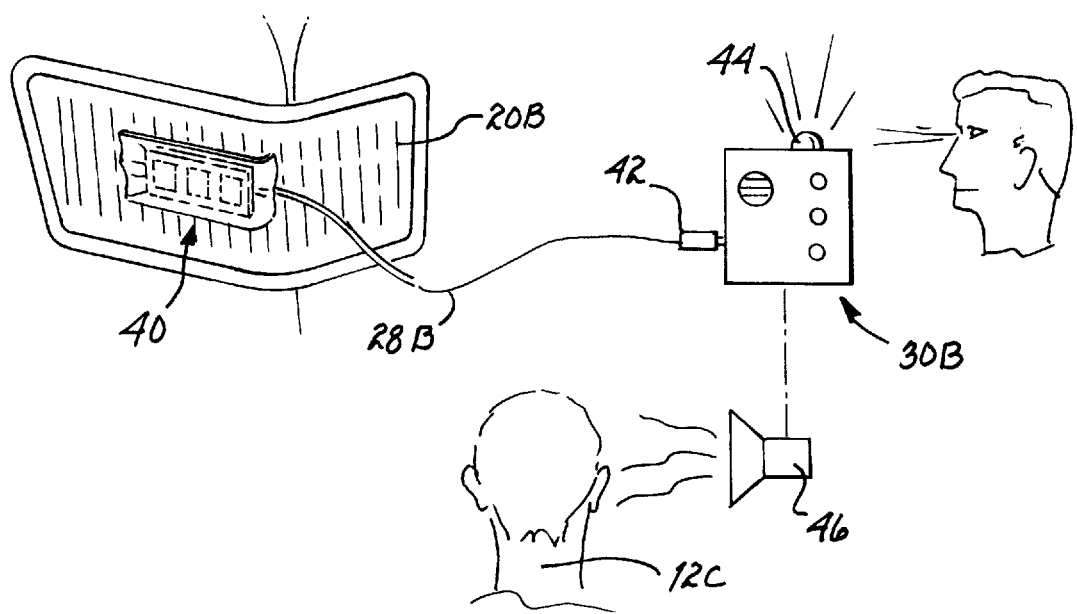

Referring to FIG. 5, another embodiment of an exterior vehicle light sensing device 40 is shown which is preferably attached to, for example, an exterior vehicle headlight 20B. The device 40 is connected by means of wire 28 to display unit 30B by means of input jack or connector 42 attached to the wire 28B. The input jack or connector 42 is inserted into a suitable socket or receptacle in the display unit 30B. In one example, light from the headlight 20B serves to generate an electrical current by means of solar cells located on an inside surface portion of the light sensing device 40, which upon being supplied to the display unit 30B, serves to produce a visual (light) indication by lighting up bulb or light 44 on the display unit 30B to be seen by person 12B and/or an audio type sound such as a buzzer or beeping sound on speaker 46 that is electrically coupled (not shown) to the display unit 30B to be heard by person 12C. If desired, multiple input sockets or receptacles (not shown) can be used in the display unit 30B to permit multiple jacks or connectors 42 (not shown) to be connected to the display unit 30B from other associated light sensing devices 40 (not shown).

Figure 6A:
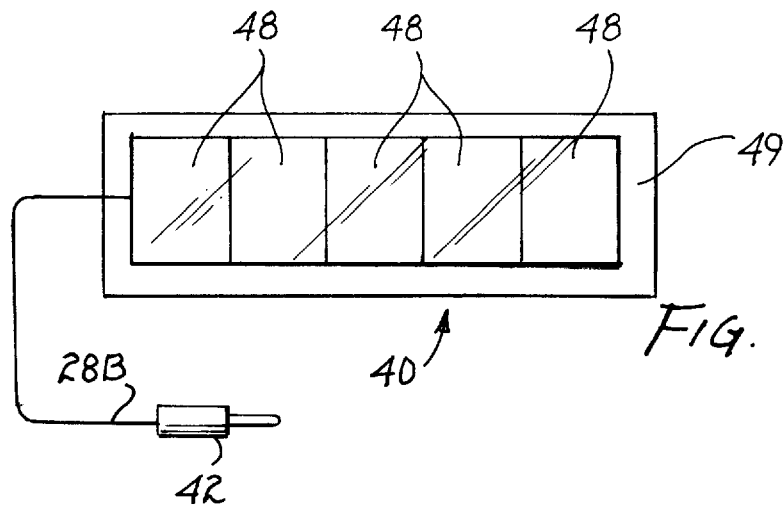
Figure 6B:
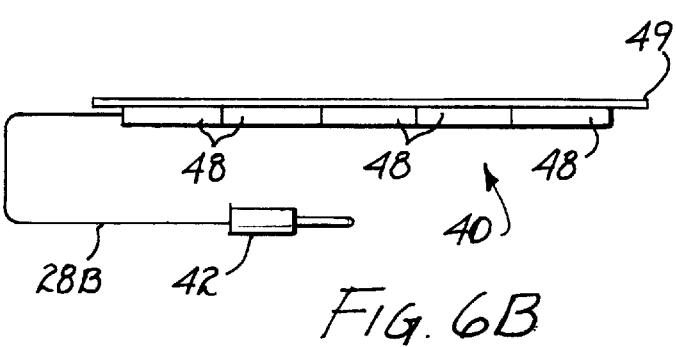
FIG. 6B is a top view of the solar cell light sensing device of FIG. 6A.
Figure 6C:
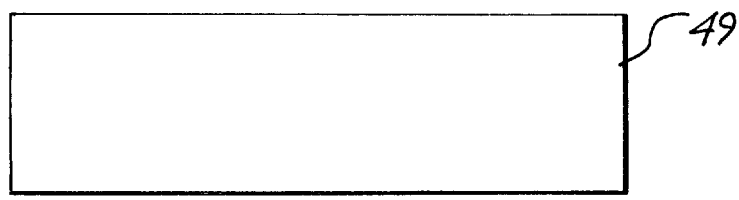
FIG. 6C is a side elevational view somewhat enlarged of the overlapping adhesive tape member that is used on the back of the solar cell light sensing device of FIG. 6A or 6B to attach the solar cell light sensing device to an exterior light as shown in FIG. 5.
Figure 6D:
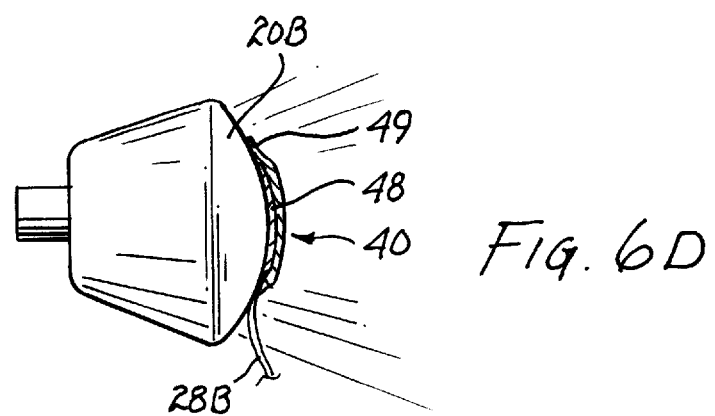
FIG. 6D is a side elevational view partly in section showing an exterior light and the solar cell light sensing device of FIG. 6A with its overlapping adhesive tape member (as shown in FIG. 6C) attached to a front surface portion of the exterior light wherein the solar cell light sensing device and attached overlapping adhesive tape member are shown in section.

Referring to FIGS. 6A, 6B, 6C and 6D, the light sensing device 40 of FIG. 5 is described and illustrated in these FIGS. 6A, 6B, 6C and 6D. In FIGS. 6A and 6B a panel or array of solar cells 48 (i.e. five panels or arrays of solar cells (otherwise known as solar photovoltaic or silicon photovoltaic solar cells) is located on one side of an adhesive backing member 49 which is on the backside portion of the solar cells 48. The purpose of the adhesive backing member 49 is to rapidly attach and/or detach the solar cells 48 to, for example, light 20B as shown in FIG. 5 and as also shown in FIG. 6D as described below and, because of the opaque qualities of the adhesive backing member 49, to prevent the solar cell light sensing device 40 from generating an electrical current from extraneous exterior light other than the source of light that is created when the headlight 20B turns on to provide a source of light directly onto the solar cell light sensing device 40.

FIG. 6C depicts the substantially rectangular configuration of the adhesive backing member 49 which is attached to the back or rear portion of the solar cell light sensing device 40 (as shown in FIG. 5) where only three solar cell panels or arrays are shown in dashed lines.

FIG. 6D is a side elevational view partly in section depicting how the solar cell light sensing device 40 is attached by means of the adhesive backing member 49 to the front portion of the headlight 20B. This view is closely related to a view from the back as shown in FIG. 5 where the solar cell light sensing device 40 is attached to the headlight 20B.

In the use of the (photodetector or photodiode) light sensing device 16, 16A of FIGS. 1–4 or in the use of the solar cell light sensing device 40 of FIGS. 5, 6A, 6B and 6D there is no need for any other electric energy source such as a D.C. battery or an A.C. source of electrical energy to operate the display unit 30, 30A of FIGS. 1, 2, 3 and 4 or the display unit 30B of FIG. 5. In other words, the light sensing device 16, 16A of FIGS. 1–4 and the solar cell light sensing device 40 of FIGS. 5, 6A, 6B and provide enough electrical current (when sensing a light) to operate the respective display unit 30, 30A or 30B without the need for any additional D.C. or A.C. source of electrical energy coupled to the above noted display units. Consequently, this makes the entire light sensing device including the associated display unit portable and useful in even remote locations without concern for additional electrical power to operate the display unit or need for any external D.C. or A.C. source of electrical energy. As a result, it is relatively simple and very cost effective to use the light sensing device including the associated display unit that is described herein and illustrated in FIGS. 1–5. Furthermore, since the combined light sensing device and associated display unit operate using a relatively low amount of electrical current, there is significantly less danger of creating injury or damage that would be associated with, for example, the use of an A.C. source of 110 volts or 240 volts.

Figure 7A:
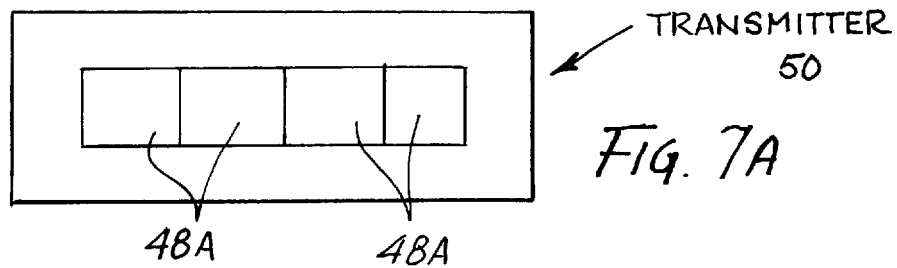
FIG. 7A is an enlarged front side elevational view showing a wireless system which uses a solar cell light sensing device of the type shown in FIG. 6A located on a side portion of a transmitter unit and electrically connected thereto to provide a source of current to the transmitter to cause it to send a signal therefrom when the solar cell light sensing device senses light.
Figure 7B:
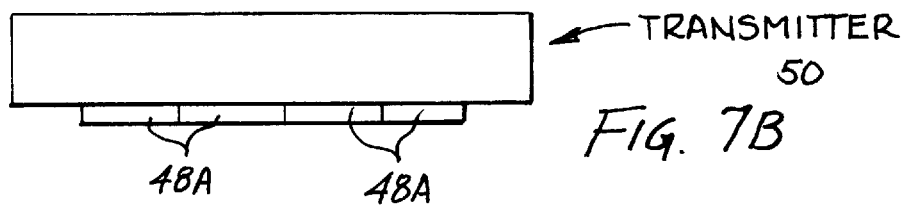
FIG. 7B is a top view of the combined solar cell light sensing device and transmitter of FIG. 7A.
Figure 7C:
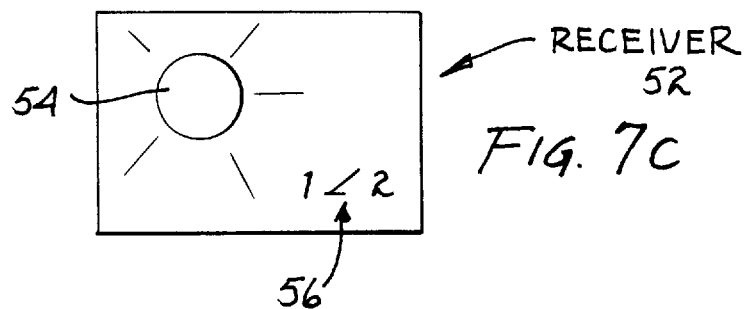
FIG. 7C is a side elevational view of a remote receiver unit for coupling to two separate combined solar cell light sensing device and transmitter units for providing a visual indication when a selected one of the two combined solar cell light sensing device and transmitter units is actuated because of sensing light.
Figure 7D:
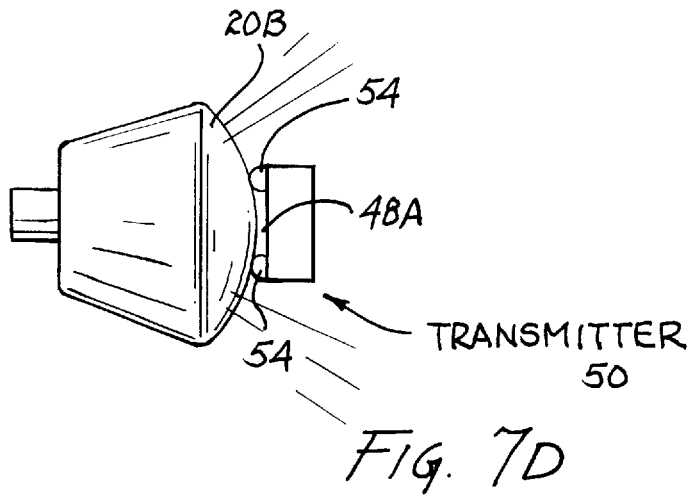

Referring to FIGS. 7A, 7B, 7C and 7D, a remote operational wireless light sensing device is illustrated which uses a plurality (i.e. four solar cell panels) of solar cells 48A that are preferably mounted on one side of a transmitter unit 50. Thus, the wire 28B of the solar cell embodiment of FIGS. 5, 6A and 6B is not shown in FIGS. 7A or 7B because it is electrically connected (not shown) behind the solar cells 48A to a socket (not shown) in the transmitter unit 50 in order to provide a source of electrical current to operate or turn on the transmitter unit 50. FIG. 7C illustrates a receiver 52 which is located spaced from the transmitter 50, but within range of the signal generated by the transmitter 50. The receiver 52 has a light bulb 54 to provide a visual indication when the receiver 52 receives a signal from the transmitter 50 that is only generated when the solar cells 48A sense a light such as when a vehicle exterior light turns on in front of the solar cells 48A. The receiver 52 is provided with a switch unit 56 that permits the receiver 52 to be coupled to either one output frequency signal of one transmitter or to another output frequency signal of another transmitter with each of these two transmitters respectively coupled up to or attached to separate exterior vehicle lights as illustrated and described herein. In FIG. 7D, the transmitter 50 is preferably attached to headlight 20B by means of, for example, a continuous picture frame shaped adhesive member 54 so that the solar cells 48A which are in front of the transmitter 50 (see FIGS. 7A and 7B) are adjacent the front portion of the headlight 20B in order to sense when the headlight 20B turns on which generates a current in the solar cells 48A to operate the adjacent attached transmitter 50 to transmit a light on signal. If desired, the combined transmitter-solar cell unit can be attached to the front surface portion of the headlight 20B by means of an overlapping adhesive member similar to that shown with respect to FIG. 6D with the variation that the overlapping adhesive member would be extended to at least the sides of the transmitter 50 and possibly, if extra adhesion was required, onto the back portion of the transmitter 50. The receiver 52 shown in FIG. 7C would be located in a selected place within the range of receiving the (light on) signal from the transmitter 50 that is coupled to the headlight 20B as shown in FIG. 7D.

Figure 8A:
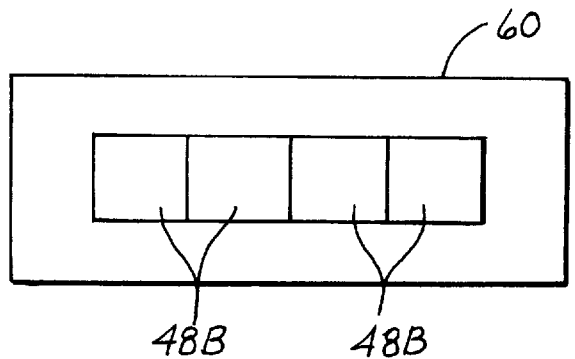
FIG. 8A is an enlarged front side elevational view showing an all-in-one system which uses a solar cell light sensing device of the type shown in FIG. 6A located on a front side portion of a combined light sensing and light indicating unit.
Figure 8B:
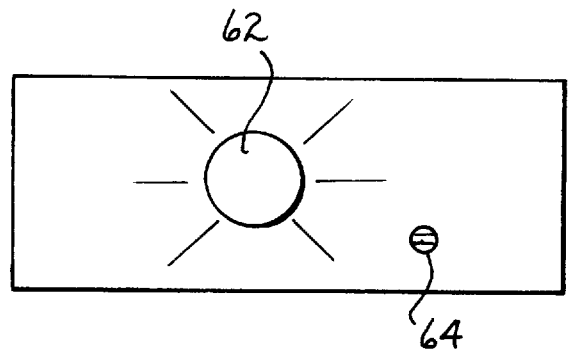
FIG. 8B is an enlarged back side elevational view of the all-in-one system of FIG. 8A having a light indicating device thereon and/or an audio indicating device.
Figure 8C:
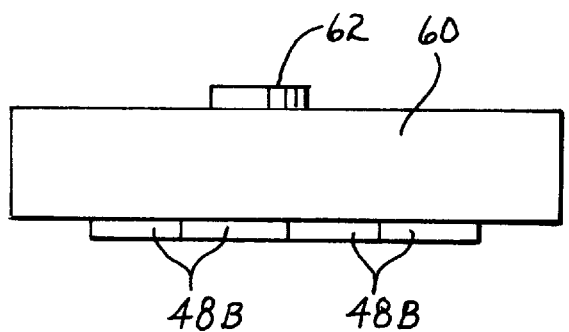
FIG. 8C is a top view of the all-in-one system of FIGS. 8A and 8B showing the solar cell light sensing elements or device on one side thereof for sensing light and, for example, a light indicating device on the other side thereof for providing a visual indication when the solar cell light sensing elements or device senses light.

FIGS. 8A, 8B and 8C illustrate an all-in-one light sensing-visual and/or audio display embodiment wherein solar cells 48B are located on one side of a single portable housing 60 (see FIG. 8A) for the purpose of sensing light from an exterior vehicle light. FIG. 8B illustrates the reverse or rear side of the housing 60 wherein a light bulb 62 and, if desired, a speaker 64 are located to provide a visual and, if desired, an audio (such as a buzzer) indication that the solar cells 48B have sensed light from an exterior vehicle light. As explained above, light sensed by the solar cells 48B generates an electrical current which is used to light the display light 62 and/or generate a sound such as a buzzer type sound from the speaker 64 thus providing one or both a visual and audio indication that, for example, a headlight (not shown) has turned on in front of the solar cells 48B. Consequently, the all-in-one unit shown in FIGS. 8A, 8B and 8C is extremely easy to use, portable and does not require either wires (between the light sensing element and display as shown in FIGS. 1–5) or a separate source of electrical energy such as a D.C. type battery or an A.C. type current source. Adhesive means such as shown by adhesive member 49 in FIG. 6D or as shown and/or described in FIG. 7D can be used to provide a quick attach-quick detach operation to rapidly couple or rapidly uncouple the solar cell 48B side portion of the housing 60 to, for example, a vehicle's exterior headlight (not shown) in FIGS. 8A, 8B and 8C.

While the invention has been particularly shown and described with reference to the preferred embodiments thereof, it will be understood by those skilled in the art that the foregoing and other changes in form and details may be made therein without departing from the spirit and scope of the invention. For example, the term visual or visual indication as used herein and in the patent claims is intended to encompass several different types of visual type displays such as a light bulb, an analog meter (such as is shown in FIG. 2) which provides a visual indication by deflection of the needle as to whether the exterior vehicle light was on or off, a LED (light emitting diode) which provides a "red"

light indication if the exterior vehicle light is on, a LCD (liquid crystal display) which would indicate by means of the display being on that the exterior vehicle light is on, etc. Because of the relatively small amount of electric current by the solar cells or photodetector (i.e. photodiode) used to sense when an exterior vehicle light is on, it may be more desirable in a number of practical use applications not to use a light bulb because only a very dim light would be generated therein due to the low amount of electric current supplied thereto, but to use one of the other above mentioned visual indicators. Further, the term vehicle as used herein is also intended to include trailers, (that may not be self powered such as trailers attached to a truck or other type of vehicle or parked as a stand alone unit), hitches, boats, etc.

What is claimed is:

1. A portable device for sensing when an exterior light on a vehicle is on comprising in combination:
   a vehicle having at least one exterior light element having an external protective surface;
   portable light sensing and electric current generating means coupled to said one exterior light element external to said external protective surface to determine if said one exterior light element is on and for generating an electric current indicating that said one exterior light is on; and
   portable display means coupled to said portable light sensing and electric current generating means for sensing said electric current and for providing at least one of a visual and audio indication at any desired location internal or external to said vehicle when said one exterior light element is on.

2. The device of claim 1 wherein said vehicle having a plurality of exterior light elements, said light sensing and electric current generating means comprising a plurality of light sensing and electric current generating means with each one of said plurality of light sensing and electric current generating means coupled to a separate one of said plurality of exterior light elements, said display means having means for indicating when at least one of and several of said plurality of exterior light elements is on.

3. The device of claim 2 wherein said display means having means for indicating when several of said plurality of exterior light elements is on.

4. The device of claim 2 wherein one of said plurality of exterior light elements is a headlight element.

5. The device of claim 2 wherein one of said plurality of exterior light elements is a rear back-up light element.

6. The device of claim 2 wherein one of said plurality of exterior light elements is a brake light element.

7. The device of claim 2 wherein one of said plurality of exterior light elements is a directional signal light element.

8. The device of claim 1 wherein said display means providing a visual indication when said one exterior light element is on.

9. The device of claim 1 wherein said display means providing an audio indication when said one external light element is on.

10. The device of claim 1 wherein said light sensing and electric current generating means consisting of solar cell means for sensing light and for generating an electrical current upon sensing light, said electrical current generated by said solar cell means supplied to said display means to actuate at least one of a visual and audio indication from said display means.

11. The device of claim 10 wherein said display means providing a visual indication upon receipt of said electrical current from said solar cell means.

12. The device of claim 10 wherein said display means providing an audio indication upon receipt of said electrical current from said solar cell means.

13. The device of claim 10 wherein said solar cell means comprising a plurality of solar cell elements having an adhesive backing member connected to a back side portion thereof and extending beyond at least one side portion of said plurality of solar cell elements and in contact with an exterior surface portion of said exterior light element.

14. The device of claim 13 wherein said solar cell elements having a single wire connection thereto, said single wire connection being electrically connected to said display means.

15. The device of claim 1 wherein said one exterior light element is a headlight element.

16. The device of claim 1 wherein said one exterior light element is a parking light element.

17. The device of claim 1 wherein said one exterior light element is a brakelight element.

18. The device of claim 1 wherein said one exterior light element is a directional signal light element.

19. The device of claim 1 wherein said display means being located within said vehicle.

20. The device of claim 1 wherein said light sensing and electric current generating means having transmitter means coupled thereto for sending out an electrical signal when said light sensing and electric current generating means senses light emitted by said exterior light element, said display means having receiver means coupled thereto for receiving said electrical signal sent out by said transmitter means of said light sensing and electric current generating means and for activating said at least one of a visual and audio indication when said one exterior light element is on.

21. The device of claim 20 wherein said light sensing and electric current generating means having solar cell means for sensing light and for generating electric current to operate said transmitter means to send said electrical signal to said receiver means of said display means to actuate at least one of a visual and audio indication from said display means that indicates that said exterior light element is on.

22. The device of claim 20 wherein said receiver means of said display means having means for receiving an electric signal from more than one transmitter means respectively associated with more than one light sensing and electric current generating means.

23. The device of claim 1 wherein said light sensing and electric current generating means are solar cells.

24. The device of claim 1 wherein said light sensing and electric current generating means is at least one photodetector.

25. The device of claim 24 wherein said photodetector is a photodiode.

26. A method for sensing when an exterior light on a vehicle is on comprising the steps of:
   providing a vehicle having at least one exterior light element having an external, protective surface;
   providing portable light sensing and electric current generating means coupled to said one exterior light element external to said external protective surface to determine if said one exterior light element is on and for generating an electric current indicating that said one exterior light is on; and
   providing portable display means coupled to said portable light sensing and electric current generating means for sensing said electric current and for providing at least one of a visual and audio indication at any desired location internal or external to said vehicle when said one exterior light element is on.

27. The method of claim 26 wherein said vehicle having a plurality of exterior light elements, said light sensing and electric current generating means comprising a plurality of light sensing and electric current generating means with each one of said plurality of light sensing and electric current generating means coupled to a separate one of said plurality of exterior light elements, said display means having means for indicating when at least one of and several of said plurality of exterior light elements is on.

28. The method of claim 27 wherein said display means having means for indicating when several of said plurality of exterior light elements is on.

29. The method of claim 27 wherein one of said plurality of exterior light elements is a headlight element.

30. The method of claim 27 wherein one of said plurality of exterior light elements is a rear back-up light element.

31. The method of claim 27 wherein one of said plurality of exterior light elements is a brake light element.

32. The method of claim 27 wherein one of said plurality of exterior light elements is a directional signal light element.

33. The method of claim 26 wherein said display means providing a visual indication when said one exterior light element is on.

34. The method of claim 26 wherein said display means providing an audio indication when said one external light element is on.

35. The method of claim 26 wherein said light sensing and electric current generating means consisting of solar cell means for sensing light and for generating an electrical current upon sensing light, said electrical current generated by said solar cell means supplied to said display means to actuate at least one of a visual and audio indication from said display means.

36. The method of claim 35 wherein said display means providing a visual indication upon receipt of said electrical current from said solar cell means.

37. The method of claim 35 wherein said display means providing an audio indication upon receipt of said electrical current from said solar cell means.

38. The method of claim 35 wherein said solar cell means comprising a plurality of solar cell elements having an adhesive backing member connected to a back side portion thereof and extending beyond at least one side portion of said plurality of solar cell elements and in contact with an exterior surface portion of said exterior light element.

39. The method of claim 38 wherein said solar cell elements having a single wire connection thereto, said single wire connection being electrically connected to said display means.

40. The method of claim 26 wherein said one exterior light element is a headlight element.

41. The method of claim 26 wherein said one exterior light element is a parking light element.

42. The method of claim 26 wherein said one exterior light element is a brakelight element.

43. The method of claim 26 wherein said one exterior light element is a directional signal light element.

44. The method of claim 26 wherein said display means being located within said vehicle.

45. The method of claim 26 wherein said light sensing and electric current generating means having transmitter means coupled thereto for sending out an electrical signal when said light sensing and electric current generating means senses light emitted by said exterior light element, said display means having receiver means coupled thereto for receiving said electrical signal sent out by said transmitter means of said light sensing and electric current generating means and for activating said at least one of a visual and audio indication when said one exterior light element is on.

46. The method of claim 45 wherein said light sensing and electric current generating means having solar cell means for sensing light and for generating electric current to operate said transmitter means to send said electrical signal to said receiver means of said display means to actuate at least one of a visual and audio indication from said display means that indicates that said exterior light element is on.

47. The method of claim 45 wherein said receiver means of said display means having means for receiving an electric signal from more than one transmitter means respectively associated with more than one light sensing and electric current generating means.

48. A portable combined light sensing and light on indication display device for an exterior light on a vehicle comprising, in combination:

a vehicle having at least one exterior light element having an external, protective surface; and portable combined light sensing and light indication display means in a single, portable unit for both sensing when said one exterior light element is on by providing an electric current when sensing when said one exterior light element is on and for sensing said electric current and for providing at least one of a visual and audio indication when said one exterior light element is on.

49. A portable wireless transmitter-receiver apparatus for sensing when an exterior light on a vehicle is on comprising, in combination:

portable solar cell means coupled to an external surface of an external, protective, light permeable member of the exterior light for sensing when the exterior light on the vehicle is on and for generating an electric current when said exterior light is on;

transmitter means coupled to said solar cell means for transmitting a signal following receipt of said electric current from said solar cell means; and receiver means spaced from said transmitter means for receiving said signal from said transmitter means and for providing at least one of a visual and audio indication that said exterior light is on.

50. A method for sensing when an exterior light on a vehicle is on comprising the steps of:

providing a vehicle having at least one exterior light element having an external, protective, light permeable member;

providing portable light sensing and electric current generating means coupled to said one exterior light element external to said light permeable member for both sensing when said one exterior light element is on and for generating an electric current indicating that said one exterior light element is on; and providing portable display means coupled to said portable light sensing and electric current generating means for providing at least one of a visual and audio indication at any desired location internal or external to said vehicle when said one exterior light element is on.

51. A method of providing combined light sensing and light on indication display device for an exterior light on a vehicle comprising the steps of:

providing a vehicle having at least one exterior light element having an external, protective surface; and providing portable combined light sensing and light indication display means in a single, portable unit located external to said surface for both sensing when said one exterior light element is on by providing an electric current when sensing when said one exterior light element is on and for sensing said electric current and for providing at least one of a visual and audio indication when said one exterior light element is on.

52. A method of providing a wireless transmitter-receiver apparatus for sensing when an exterior light on a vehicle is on comprising the steps of:

providing portable solar cell means coupled to an external surface of an external, protective, light permeable member of the exterior light for sensing when the exterior light on the vehicle is on and for generating an electric current when said exterior light is on;

providing transmitter means coupled to said solar cell means for transmitting a signal following receipt of said electric current from said solar cell means; and providing receiver means spaced from said transmitter means for receiving said signal from said transmitter means and for providing at least one of a visual and audio indication that said exterior light is on.

* * * * *